United States Patent
Kang

(10) Patent No.: US 7,936,633 B2
(45) Date of Patent: May 3, 2011

(54) CIRCUIT AND METHOD OF GENERATING VOLTAGE OF SEMICONDUCTOR MEMORY APPARATUS

(75) Inventor: Khil-Ohk Kang, Gyeonggi-do (KR)

(73) Assignee: Hynix Semiconductor Inc., Gyeonggi-Do (KR)

( * ) Notice: Subject to any disclaimer, the term of this patent is extended or adjusted under 35 U.S.C. 154(b) by 19 days.

(21) Appl. No.: 12/575,663

(22) Filed: Oct. 8, 2009

(65) Prior Publication Data

US 2010/0020623 A1    Jan. 28, 2010

Related U.S. Application Data

(62) Division of application No. 11/822,814, filed on Jul. 10, 2007, now Pat. No. 7,602,664.

(30) Foreign Application Priority Data

Nov. 14, 2006  (KR) .......................... 10-2006-0112257

(51) Int. Cl.
   *G11C 5/14* (2006.01)
(52) U.S. Cl. .................... 365/226; 365/228; 365/189.11; 323/313; 323/304
(58) Field of Classification Search .................. 365/226, 365/228, 189.11; 323/313, 304
   See application file for complete search history.

(56) References Cited

U.S. PATENT DOCUMENTS

| | | | |
|---|---|---|---|
| 5,349,559 A | 9/1994 | Park et al. | |
| 5,434,498 A | 7/1995 | Cordoba et al. | |
| 5,448,199 A * | 9/1995 | Park | 327/546 |
| 5,452,896 A | 9/1995 | Core | |
| 5,475,646 A * | 12/1995 | Ogihara | 365/222 |
| 5,497,348 A | 3/1996 | Tsay | |
| 5,745,499 A * | 4/1998 | Ong | 714/721 |
| 5,936,910 A | 8/1999 | Hashimoto | |
| 6,185,139 B1 | 2/2001 | Pantelakis et al. | |
| 6,414,890 B2 | 7/2002 | Arimoto et al. | |
| 6,473,346 B1 | 10/2002 | Kim et al. | |
| 6,495,994 B1 * | 12/2002 | Butler et al. | 323/273 |
| 6,661,218 B2 | 12/2003 | Kim | |
| 6,707,737 B2 * | 3/2004 | Tanizaki | 365/201 |
| 6,751,134 B2 | 6/2004 | Choi et al. | |
| 6,885,235 B2 * | 4/2005 | Tomishima et al. | 327/538 |
| 6,891,766 B2 * | 5/2005 | Choi et al. | 365/201 |
| 6,909,648 B2 | 6/2005 | Terzioglu et al. | |
| 7,016,248 B2 * | 3/2006 | Park et al. | 365/226 |
| 7,224,627 B2 | 5/2007 | Gnat et al. | |
| 7,298,157 B2 | 11/2007 | Kim | |
| 7,539,072 B2 * | 5/2009 | Kang | 365/201 |
| 7,602,664 B2 * | 10/2009 | Kang | 365/226 |
| 7,606,103 B2 * | 10/2009 | Jang | 365/226 |
| 2005/0231269 A1 | 10/2005 | Kim et al. | |
| 2006/0091938 A1 | 5/2006 | Kim | |

FOREIGN PATENT DOCUMENTS

| | | |
|---|---|---|
| JP | 409045097 A | 2/1997 |
| JP | 409198899 A | 7/1997 |
| JP | 02001143498 A | 5/2001 |
| KR | 1020030077153 | 10/2003 |
| KR | 1020050079538 | 8/2005 |

* cited by examiner

*Primary Examiner* — Viet Q Nguyen

(74) *Attorney, Agent, or Firm* — Venable LLP; Jeffri A. Kaminski

(57) ABSTRACT

A circuit for generating a voltage of a semiconductor memory apparatus includes a control unit that outputs a driving control signal in response to an enable signal and a burn-in signal, a first voltage generating unit that generates and outputs a first voltage in response to the enable signal, and a voltage maintaining unit that maintains the first voltage in response to the driving control signal.

4 Claims, 2 Drawing Sheets

CIRCUIT AND METHOD OF GENERATING VOLTAGE OF SEMICONDUCTOR MEMORY APPARATUS

This application is a divisional of U.S. patent application Ser. No. 11/822,814, filed Jul. 10, 2007, now U.S. Pat. No. 7,602,664 the subject matter of which application is incorporated herein by reference in its entirety.

This application claims the benefit of Korean Patent Application No. 10-2006-0112257, filed on Nov. 14, 2006, in the Korean Intellectual Property Office, the disclosure of which is incorporated herein in its entirety by reference.

BACKGROUND OF THE INVENTION

1. Technical Field

The present invention relates to a circuit and method of generating a voltage of a semiconductor memory apparatus, and more particularly, to a circuit and method of generating a voltage of a semiconductor memory apparatus to maintain stable a potential level of an internal voltage.

2. Related Art

In general, dynamic random access memories (DRAMs) use a core voltage VCORE when high-level data is written in a memory cell. Specifically, the DRAM includes a core voltage generating circuit that generates a core voltage VCORE according to an external voltage VDD. The core voltage VCORE is applied to a bit line (herein, a bit line serves as a drain of a cell transistor), and may be stored as high-level data in a capacitor that is connected to the cell transistor. However, as the external voltage VDD increase, the core voltage VCORE goes upper. Excessive operating of the core voltage generating circuit increases and outputs the core voltage VCORE. A bit line precharge voltage VBLP that is generated from the core voltage VCORE is also increased.

Meanwhile, in normal mode, a bootstrapped voltage VPP that is applied to a gate of a cell transistor and a threshold voltage Vth of the cell transistor are constant. Accordingly, though the core voltage VCORE is increased, a whole voltage level of the raised core voltage VCORE is not securely stored, the core voltage VCORE is stored as a high-level data in a capacitor connected to the cell transistor. However, the bit line precharge voltage VBLP is increased due to the increased core voltage VCORE. Accordingly, when a sense amplifier is operated, a small voltage ΔV charge shared voltage between a voltage level of the high-level data that is stored in a capacitor and bit line causes a defect in a DRAM. For this reason, the core voltage VCORE can maintain itself stable, whether the external voltage VDD is low or not. Therefore, the semiconductor memory apparatus uses a core voltage maintaining circuit that decreases the core voltage VCORE when the core voltage VCORE increases. Such that the core voltage VCORE is reduced from being changed according to the external voltage VDD to stably supply the core voltage VCORE. As a result, an internal circuit that received the core voltage VCORE can perform a stable operation.

Meanwhile, a burn-in test mode is a test process that applies a stress test to the DRAM to detect defective cells in advance. That is, during the burn-in test mode, the stress test is applied to the DRAM over a long period of time to detect the defective cells. For example, a high temperature and a high voltage are applied to the DRAM to detect the defective cells.

During the burn-in test mode, a voltage that is higher than the bootstrapped voltage VPP is applied to a gate of a cell transistor. However, when the increased core voltage VCORE is applied to a bit line, the core voltage VCORE is equal to or higher than a predetermined threshold voltage. Thus, the core voltage VCORE as high-level data may be stored in a capacitor of a cell transistor. Further, even when the bit line precharge voltage VBLP is increased due to the increased core voltage VCORE the increased core voltage VCORE is already stored in the capacitor that is connected to the cell transistor, and the small voltage ΔV that is to be charge-shared is not decreased. The small voltage ΔV during the burn-in test mode may be larger than the small voltage ΔV during the normal mode. Accordingly, during the burn-in test mode, the operation of the core voltage maintaining circuit becomes a supplemental operation, which causes unnecessary power consumption.

SUMMARY OF THE INVENTION

Embodiments of the invention provide a circuit and method of generating a voltage of a semiconductor memory apparatus, capable to maintain a voltage level of an internal voltage stable.

According to one embodiment, a circuit for generating a voltage of a semiconductor memory apparatus includes a control unit that outputs a driving control signal in response to an enable signal and a burn-in signal, a first voltage generating unit that generates and outputs a first voltage in response to the enable signal, and a voltage maintaining unit that maintains the first voltage in response to the driving control signal.

The first voltage generating unit and the voltage maintaining unit may receive a reference voltage.

The circuit for generating may include a reference voltage generating unit that generates the reference voltage, a second voltage generating unit that is supplied with the reference voltage and generates and outputs a second voltage in response to the burn-in signal and the enable signal, and further include a third voltage generating unit that receives the first voltage and generates and outputs a third voltage in response to the enable signal.

According to another embodiment, a circuit for generating a voltage of a semiconductor memory apparatus includes a control unit that outputs a driving control signal in response to an enable signal and a burn-in signal, and a voltage maintaining unit that is supplied with the driving control signal and a reference voltage and maintains a first voltage. The voltage maintaining unit is inactivated when the burn-in signal is activated.

According to other embodiments, a method of generating a voltage of a semiconductor memory apparatus includes generating a first voltage in response to an enable signal and a reference voltage, outputting a driving control signal in response to the enable signal and a burn-in signal, and adjusting a voltage level of the first voltage in response to the driving control signal and the reference voltage.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION OF EXEMPLARY EMBODIMENT

Figure 1:
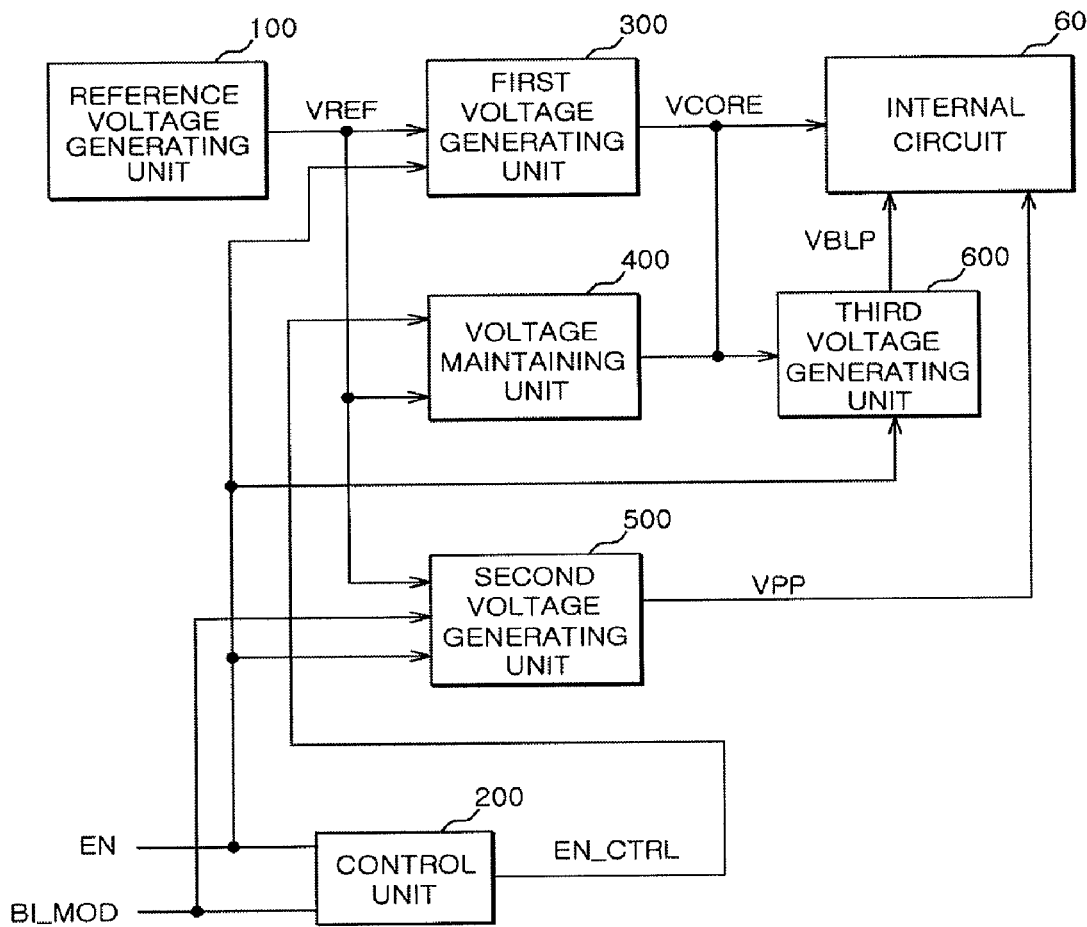
FIG. 1 is a block diagram illustrating an inner structure of a circuit for generating a voltage of a semiconductor memory apparatus according to an embodiment of the present invention.

The attached drawings for illustrating preferred embodiments of the present invention are referred to in order to gain a sufficient understanding of the present invention, the merits thereof, and the objectives accomplished by the implementation of the present invention.

Hereinafter, the present invention will be described in detail by explaining preferred embodiments of the invention with reference to the attached drawings. Like reference numerals in the drawings denote like elements.

As shown in FIG. 1, the circuit for generating a voltage of the semiconductor memory apparatus according to an embodiment of the present invention includes a reference voltage generating unit 100, a control unit 200, a first voltage generating unit 300, a voltage maintaining unit 400, a second voltage generating unit 500, and a third voltage generating unit 600.

First, the reference voltage generating unit 100 generates a reference voltage VREF having a predetermined voltage level and supplies the reference voltage VREF to each of the first voltage generating unit 300, the voltage maintaining unit 400, and the second voltage generating unit 500. In this case, the reference voltage generating unit 100 may include a bipolar-type reference voltage generator or a MOS-type reference voltage generator.

The control unit 200 supplies a driving control signal EN_CTRL to the voltage maintaining unit 400 in response to an enable signal EN and a burn-in signal BI_MOD.

The first voltage generating unit 300 receives the enable signal EN and the reference voltage VREF and supplies a first voltage VCORE. In this case, the first voltage VCORE is not limited to a specific voltage, but is exemplified as a core voltage that is used as power when driving a sense amplifier S/A and is used when high-level data is stored in a memory cell.

The voltage maintaining unit 400 receives the driving control signal EN_CTRL and the reference voltage VREF to decrease the first voltage VCORE.

The second voltage generating unit 500 receives the burn-in signal BI_MOD, the enable signal EN, and the reference voltage VREF to generate a second voltage VPP. Here, the second voltage VPP is exemplified as an bootstrapped voltage that drives a word line WL.

The third voltage generating unit 600 receives the enable signal EN and the first voltage VCORE to generate a third voltage VBLP. In this case, the third voltage VBLP is not limited to a specific voltage, but is exemplified as a precharge voltage that is generated from the first voltage VCORE and is used to precharge a bit line BL.

The first voltage VCORE, the second voltage VPP, and the third voltage VBLP that have been described above are supplied to the internal circuit 60 of the semiconductor memory apparatus.

Figure 2:
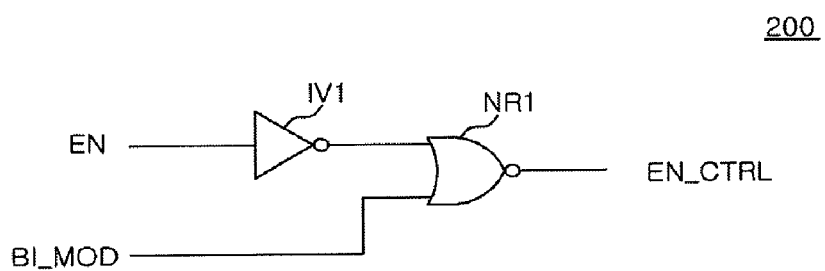
FIG. 2 is a circuit diagram illustrating a control unit shown in FIG. 1.

As shown in FIG. 2, the control unit 200 includes an inverter unit IV1 and a combination unit including NOR gate NR1.

First, the inverter unit, IV1 receives the enable signal EN and supplies a signal, which is obtained by inverting a signal level of the enable signal EN, to the NOR gate NR1. The NOR gate NR1 receives the output signal of the inverter IV1 and the burn-in signal BI_MOD, to output the driving control signal EN_CTRL. In this case, the burn-in signal BI_MOD determines whether the semiconductor memory apparatus enters a burn-in test mode or not. That is, if the burn-in signal BI_MOD is activated, the semiconductor memory apparatus enters the burn-in test mode. When the burn-in signal BI_MOD is inactivated, the semiconductor memory apparatus enters a normal mode.

The structure of the control unit 200 is not limited to the structure according to an embodiment of the present invention, and may be implemented as a logic circuit that outputs the activated driving control signal EN_CTRL when the enable signal EN is activated and the burn-in signal BI_MOD is inactivated, and outputs the inactivated driving control signal EN_CTRL when the burn-in signal BI_MOD is activated.

Figure 3:
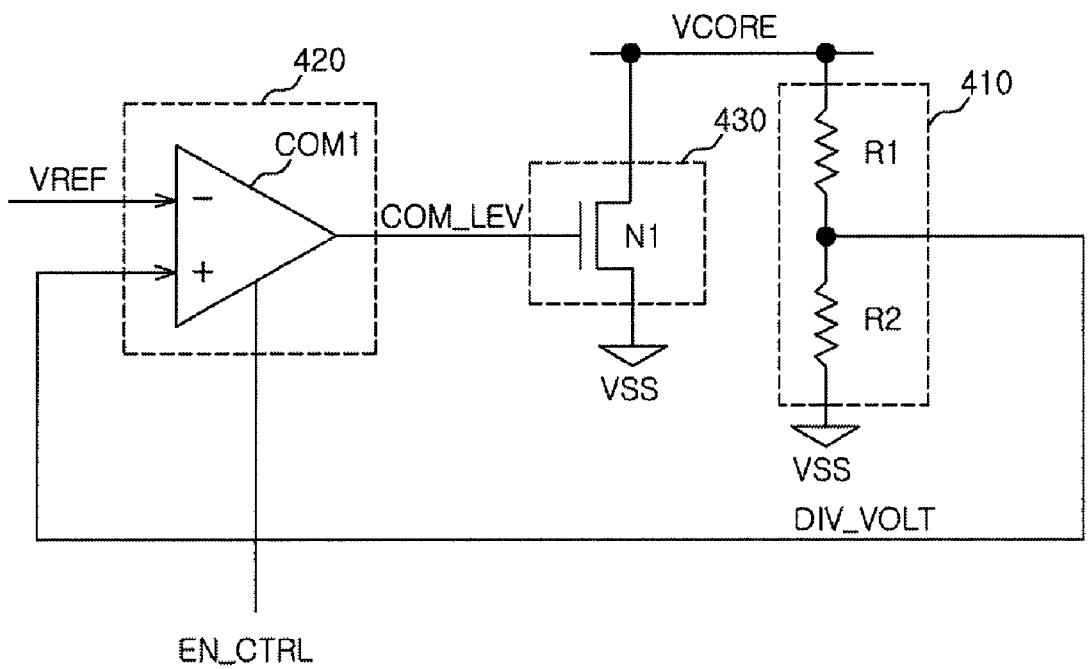
FIG. 3 is a circuit diagram illustrating a voltage maintaining unit shown in FIG. 1.

Referring to FIG. 3, the voltage maintaining unit 400 includes a voltage distributing unit 410, a comparing unit 420, and a dropping unit 430.

First, the voltage distributing unit 410 distributes the first voltage VCORE and outputs a distribution voltage DIV_VOLT. Specifically, the voltage distributing unit 410 includes a first resistor R1 and a second resistor R2 that are connected in series between a first voltage terminal VCORE and a ground voltage terminal VSS. A distributed voltage, which is distributed by the resistors R1 and R2, is output as the distribution voltage DIV_VOLT from a common node between the first resistor R1 and the second resistor R2. The voltage distributing unit 410 includes two or more resistors that are connected in series to each other, and adjusts a voltage level of the distribution voltage DIV_VOLT.

The comparing unit 420 is activated in response to the driving control signal EN_CTRL to compare the reference voltage VREF and the distribution voltage DIV_VOLT so as to supply a comparison signal COM_LEV.

The comparing unit 420 includes a comparator COM1 to compare the reference voltage VREF and the distribution voltage DIV_VOLT. In this case, the comparator COM1 may be composed of a current-mirror-type differential amplifier, but is not limited thereto. That is, the comparator COM1 may be a circuit that compares two signals, for example, the reference voltage VREF and the distribution voltage DIV_VOLT to supply the comparison signal COM_LEV, within the scope of the present invention.

The dropping unit 430 includes a transistor N1 to decrease the first voltage VCORE in response to the comparison signal COM_LEV. The transistor N1 includes a gate terminal that receives the comparison signal COM_LEV, a drain terminal that is supplied with the first voltage VCORE, and a source terminal that is supplied with the ground voltage VSS.

Figure 4:
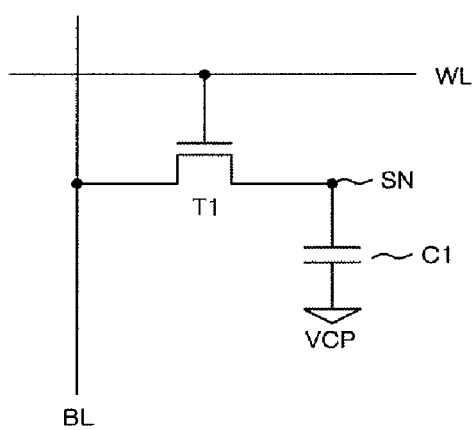
FIG. 4 is a circuit diagram illustrating a unit memory cell transistor.

FIG. 4 is a circuit diagram illustrating a unit memory cell.

The operation of the circuit for generating a voltage of the semiconductor memory apparatus according to an embodiment of the present invention will now be described with reference to FIGS. 1 to 4.

On the assumption that the first voltage VCORE is a core voltage, the second voltage VPP is a bootstrapped voltage, and the third voltage VBLP is a precharge voltage. The operation of the circuit for generating a voltage of the semiconductor memory apparatus will be described in detail by using a memory cell 60-1 shown in FIG. 4.

The circuit for generating a voltage of the semiconductor memory apparatus generates the first voltage VCORE in response to the enable signal EN and the reference voltage VREF. In the case where the semiconductor memory apparatus enters the normal mode in response to the driving control signal EN_CTRL, if the first voltage VCORE is increased, the circuit for generating a voltage maintains the first voltage VCORE at a predetermined voltage level. However, in the case where the semiconductor memory apparatus enters the burn-in test mode, the first voltage VCORE is used without a voltage drop even when the voltage level of the first voltage VCORE becomes larger than a predetermined voltage level.

Specifically, if the reference voltage generating unit 100 generates the reference voltage VREF and the enable signal EN is activated, the first voltage generating unit 300 generates the first voltage VCORE in response to the reference voltage VREF. In this case, the control unit 200 logically combines the enable signal EN and the burn-in signal BI_MOD and outputs the driving control signal EN_CTRL. The driving control signal EN_CTRL is activated when the enable signal EN is activated and the burn-in signal BI_MOD is inactivated, but is inactivated when the burn-in signal BI_MOD is activated.

As a result, the voltage maintaining unit 400 is activated when the semiconductor memory apparatus enters the normal mode in response to the above-described driving control signal EN_CTRL, and is inactivated when the semiconductor memory apparatus enters the burn-in test mode.

Accordingly, when the enable signal EN is activated and the burn-in signal BI_MOD is inactivated, that is, during the normal mode, the second voltage generating unit 500 generates and outputs the bootstrapped voltage VPP having the predetermined voltage level. Further, when the enable signal EN is activated and the burn-in signal BI_MOD is activated, that is, during the burn-in test mode, the second voltage generating unit 500 generates and outputs the bootstrapped voltage VPP that has a voltage level higher than the predetermined voltage level.

The third voltage generating unit 600 distributes the core voltage VCORE and outputs the precharge voltage VBLP. Accordingly, when the third voltage generating unit 600 receives the increased core voltage VCORE, the third voltage generating unit 600 supplies an increased bit line precharge voltage VBLP.

The voltage maintaining unit 400 is activated in response to the driving control signal EN_CTRL, to down the core voltage VCORE in response to the reference voltage VREF.

It is assumed that the external voltage VDD is set to 1.8 V, the core voltage VCORE is set to 1.6 V, the bootstrapped voltage VPP is set to 3.2 V, and the threshold voltage Vth of the transistor N1 is set to 1.6 V. Further, it is assumed that the voltage level of the bit line precharge voltage VBLP is half as much as the voltage level of the core voltage VCORE.

As the external voltage VDD increases, the core voltage VCORE goes higher. As a result, the precharge voltage VBLP is also increased. When the semiconductor memory apparatus enters the normal mode, the control unit 200 receives the activated high-level enable signal EN and the inactivated low-level burn-in signal BI_MOD. Accordingly, the control unit 200 outputs the driving control signal EN_CTRL that is activated at a high level.

As the external voltage VDD is further increased, the core voltage VCORE is increased to 1.8 V and the precharge voltage VBLP may be increased. Accordingly, the voltage maintaining unit 400 decreases the activated core voltage VCORE to 1.6 V in response to the driving control signal EN_CTRL. As a result, the precharge voltage VBLP that is generated from the core voltage VCORE becomes 0.8 V.

In the active state, a voltage of 3.2 V is applied to a gate of a transistor T1 of the memory cell 60-1, and the threshold voltage is 1.6 V. If the transistor T1 of the memory cell 60-1 is turned on, the core voltage VCORE of 1.6 V is applied to a storage node SN.

In the precharge state after the active state is completed, the bit line BL is precharged with a voltage of 0.8 V. That is, if the core voltage VCORE is increased, the voltage maintaining unit 400 decreases the increased core voltage VCORE to the original core voltage VCORE. Therefore, the semiconductor memory apparatus operates normally.

Next, the operation of the circuit for generating a voltage during the burn-in test mode will be described. In this case, since the enable signal EN is activated at a high level and the burn-in signal BI_MOD is activated at a high level, the control unit 200 outputs the driving control signal EN_CTRL that is inactivated at a low level.

Generally, in the burn-in test mode, the semiconductor memory apparatus uses the bootstrapped voltage VPP in a state where the voltage level of the bootstrapped voltage VPP is increased by 1 V or more, as compared with the predetermined voltage level. That is, the second voltage generating unit 500 generates the bootstrapped voltage VPP of 4.2 V in response to the burn-in signal BI_MOD. During the burn-in test mode, even when the core voltage VCORE is increased, a sensing speed is not decreased at the time of sharing charges. Thus, the circuit for generating a voltage of the semiconductor memory apparatus inactivates the voltage maintaining unit 400. Accordingly, since the operation for decreasing the core voltage VCORE is inactivated in the voltage maintaining unit 400 of the circuit for generating a voltage of the semiconductor memory apparatus according to the prior art, current consumption can be reduced. That is, in an active state during the burn-in test mode, a voltage of 4.2 V is applied to the gate of the transistor T1 of the memory cell 60-1. The threshold voltage is set to 1.6 V in advance, and the voltage of 4.2 V is applied to the gate of the transistor T1. Thus, even when the core voltage VCORE is increased to 1.8 V, it is possible to securely turn on the cell transistor 60-1. Accordingly, a whole voltage level of the core voltage VCORE can be applied to the storage node SN. Then, in the precharge state, the bit line BL is precharged with a voltage of 0.9 V. That is, since the bit line precharge voltage VBLP is increased according to the increased core voltage VCORE, the bit line precharge voltage VBLP is increased so as to be 0.1 V larger than the precharge voltage during the normal mode.

Then, when the precharge state becomes the active state again, the data that are stored in the memory cell 60-1 are sharing charges to the bit line BL. Accordingly, the voltage difference (1.8 V−0.9 V=0.9 V) between the voltage of the storage node SN and the precharge voltage VBLP is larger than the voltage difference (1.6 V−0.8 V=0.8 V) between the predetermined core voltage VCORE and the predetermined precharge voltage VBLP. That is, since a small voltage to be detected by the sense amplifier is increased, a sensing speed is decreased at the time of sharing charges.

As described above, according to an embodiment, the voltage maintaining unit 400 is inactivated during the burn-in test mode, which reduces the amount of current that is unnecessarily consumed in the voltage maintaining unit 400.

It will be apparent to those skilled in the art that various modifications and changes may be made without departing from the scope and spirit of the invention. Therefore, it should be understood that the above embodiments are not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

According to the circuit and method of generating a voltage of the semiconductor memory apparatus according to an embodiment of the present invention, it is possible to control a voltage drop circuit that is unnecessarily driven during the burn-in test mode, which reduces current consumption.

What is claimed is:

1. A method of generating a voltage of a semiconductor memory apparatus, the method comprising:
   generating a first voltage in response to an enable signal and a reference voltage;
   outputting a driving control signal in response to the enable signal and a burn-in signal; and
   adjusting a voltage level of the first voltage in response to the driving control signal and the reference voltage.

2. The method of claim 1,
   wherein in the outputting of the driving control signal, the driving control signal is activated and output when the enable signal is activated and the burn-in signal is inactivated, and the driving control signal is inactivated when the burn-in signal is activated.

3. The method of claim 2,
   wherein the adjusting of the voltage level of the first voltage comprises:
   distributing the first voltage and outputting a distribution voltage;
   comparing the reference voltage and the distribution voltage in response to the driving control signal so as to output a comparison signal; and
   dropping the first voltage in response to the comparison signal and adjusting the voltage level of the first voltage.

4. The method of claim 1,
   wherein when the burn-in signal is activated, the first voltage is output in its current state.

* * * * *